US 8,816,696 B2

(12) United States Patent
Kogasumi

(10) Patent No.: US 8,816,696 B2
(45) Date of Patent: Aug. 26, 2014

(54) CONTINUITY TESTING DEVICE

(75) Inventor: Kozo Kogasumi, Makinohara (JP)

(73) Assignee: Yazaki Corporation, Tokyo (JP)

( * ) Notice: Subject to any disclaimer, the term of this patent is extended or adjusted under 35 U.S.C. 154(b) by 178 days.

(21) Appl. No.: 13/067,992

(22) Filed: Jul. 14, 2011

(65) Prior Publication Data

US 2012/0019259 A1    Jan. 26, 2012

(30) Foreign Application Priority Data

Jul. 20, 2010    (JP) .................................. 2010-162573

(51) Int. Cl.
*G01R 31/04* (2006.01)
(52) U.S. Cl.
USPC ............ 324/538; 438/135; 438/136; 438/137
(58) Field of Classification Search
CPC ...... H01R 13/64; H01R 13/24; H01R 13/639;
H01R 13/502; H01R 13/631; G01R 31/04;
G01R 31/026
USPC ........... 324/538, 439, 537, 539; 439/135–137
See application file for complete search history.

(56) References Cited

U.S. PATENT DOCUMENTS

| 5,498,966 | A | * | 3/1996 | Yamamoto | 324/538 |
| 5,647,774 | A | * | 7/1997 | Yamamoto | 439/752 |
| 5,694,043 | A | * | 12/1997 | Kodama | 324/538 |
| 5,831,438 | A | * | 11/1998 | Okura | 324/538 |
| 6,054,849 | A | | 4/2000 | Collier et al. | |
| 6,157,197 | A | * | 12/2000 | Iwasaki | 324/538 |
| 6,638,109 | B2 | * | 10/2003 | Kurimoto et al. | 439/595 |
| 6,805,592 | B2 | * | 10/2004 | Kurimoto | 439/752 |
| 7,476,123 | B2 | * | 1/2009 | Kobayashi et al. | 439/489 |
| 2009/0134888 | A1 | * | 5/2009 | Sugiyama et al. | 324/693 |

FOREIGN PATENT DOCUMENTS

| EP | 0565080 A2 | 10/1993 |
| JP | 2001-066342 A | 3/2001 |
| JP | 2007-085926 A | 4/2007 |

OTHER PUBLICATIONS

Office Action dated Apr. 16, 2012, issued for the corresponding Portuguese Patent Application No. 105815 and an English summary provided by a foreign associate.
Chinese Office Action dated Oct. 29, 2013, issued for the corresponding Chinese Patent Application No. 201080035938.7.

* cited by examiner

*Primary Examiner* — Huy Q Phan
*Assistant Examiner* — Giovanni Astacio-Oquendo
(74) *Attorney, Agent, or Firm* — Edwards Wildman Palmer LLP

(57) ABSTRACT

A continuity testing device is provided which can reliably detect incomplete-fitting of the retainer of the connector. The continuity testing device includes a connector guide block into which the connector is inserted in a transverse direction and which is fixed above an opening formed on a cover plate of a case of the continuity testing device, a detection plate provided to the connector guide block and arranged above the connector so as to contact with the incompletely-fitted retainer of the connector when moved downward, a detection pin arranged at the detection plate, a continuity testing part arranged to move in the vertical direction toward the connector, a drive mechanism that operates the detection plate to move in the vertical direction in conjunction with the continuity testing part, and a switch that is activated by the detection pin when the detection pin is completely moved down to the switch.

7 Claims, 7 Drawing Sheets

CONTINUITY TESTING DEVICE

CROSS REFERENCE TO RELATED APPLICATION

The priority application Japanese Patent Application No. 2010-162573 upon which this patent application is based is hereby incorporated by reference.

BACKGROUND OF THE INVENTION

1. Field of the Invention

The present invention relates generally to a continuity testing device. More specifically, the present invention is directed to a continuity testing device having a mechanism for detecting incomplete-fitting of a retainer of a connector.

2. Description of the Related Art

In a conventional continuity testing device used to test an electrical continuity of a connector of a wire harness, the connector is typically inserted into the continuity testing device along a vertical direction downward from an upward position, or along a horizontal direction from the front into the back of the continuity testing device.

One such continuity testing device is disclosed in Japanese Patent Application Publication No. 2007-85926 (hereinafter referred to as Conventional Art 1). For the continuity testing device according to Conventional Art 1, a connector is inserted into a connector insertion part of the continuity testing device downward from an upward position, then a continuity testing part located below the connector insertion part and having probe pins is moved upward towards the connector insertion part by driving a vertical air cylinder, thereby making the probe pins in contact with a terminal of an electric wire in the connector. In such manner, the electric wire connected to the terminal and an electric wire connected to the probe pins together form a closed circuit via a control unit, thereby detecting the electrical continuity.

Another example of a conventional continuity testing device is disclosed in Japanese Patent No. 3446675 (hereinafter referred to as Conventional Art 2). In this disclosure, a connector is provided with a retainer fitted to a recess formed on a side surface of the connector so as to securely fix a terminal within the connector. For this continuity testing device according to Conventional Art 2, the connector is inserted into a connector insertion part in a horizontal direction from the front, and the connector insertion part is provided with a detection projection. If the retainer is not completely fitted to the recess of the connector and thus protruding from the connector, the above-described detection projection will contact with the protruded retainer when the connector is inserted into the connector insertion part, thereby preventing the connector from being inserted further into the connector insertion part. In this way, the incomplete-fitting of the retainer is detected.

However, the continuity testing device according to Conventional Art 1 has a problem as described below. Referring to FIG. 10, a connector 74 to be tested for continuity is provided with a step-like connecter housing 71 having a recess (step) 72 located at an upper portion of the connector 74 adjacent to an electric wire 75 and a retainer 73 fitted in the recess. A reference sign 77 indicates a connector locking member. As can be seen from the illustration, the width of a connector insertion part 76 is defined by the size of an end 71a of the connector 74 which is larger than the size of the upper portion of the connecter 74 with the recess 72 and the retainer 73. Thus, it is difficult to provide to the connector insertion part 76 the above-described detection projection for detecting the incomplete-fitting of the retainer 73.

Furthermore, the continuity testing device according to Conventional Art 2 has a problem that, when a worker inserts the connector with the incompletely-fitted retainer into the connector insertion part, the worker hardly notices that the incompletely-fitted retainer is contacted with the detection projection. Thus, the worker continues to push the connector further into the connector insertion part, thereby lowering the accuracy of detection of the incompletely-fitted retainer, or possibly causing deformation or damage of the retainer.

Furthermore, there is required a separate continuity testing device for an exclusive use for the step-like shaped connector having the retainer fitted at the recess, causing an increase in cost.

SUMMARY OF THE INVENTION

An object of the present invention is thus to solve the above-described problems by providing a continuity testing device which allows the connector with the retainer fitted at the recess of the connector to be inserted smoothly into the connector insertion part along the transverse direction, which can perform reliable detection of the incomplete-fitting of the retainer, which can prevent the damage to the retainer when detecting the incomplete-fitting of the retainer and which can reduce the cost of the continuity testing device.

In order to achieve the above-mentioned object, the present invention provides, in a first aspect, a continuity testing device including: a connector guide block fixed above an opening formed at an upper cover plate of a case of the continuity testing device, the connector guide block being arranged to guide an insertion of the connector into the connector guide block in a transverse direction; a detection plate provided at the connector guide block so as to move in a vertical direction, the detection plate being located above the connector placed within the connector guide block such that when moved downward the detection plate contacts with a retainer of the connector which is incompletely fitted to the connector; a detection pin provided at the detection plate; a continuity testing part having a probe pin and arranged to move in the vertical direction toward the connector; a drive mechanism that activates the detection plate to move in the vertical direction in conjunction with the continuity testing part; and a switch arranged to be activated by the detection pin when the detection pin is completely moved down to the switch.

According to the first aspect of the present invention described above, the drive mechanism operates the continuity testing part to move upward, thereby moving the detection plate downward. Then, if the retainer is incompletely-fitted to the connector, and thus the retainer is projecting from the connector, a lower end of the detection plate will contact with an upper end of the retainer. Thus, the detection plate and the detection pin are stopped and are prevented from moving further in the downward direction, so the detection pin does not activate the switch. Therefore, the incomplete-fitting of the retainer can be detected reliably by, for example, using a timer-controlled operation. If the retainer is completely fitted to the connector, then the detection plate is allowed to move downward without making contact with the retainer. Thus the switch is activated, thereby detecting no abnormality.

Since the detection plated is located above the retainer of the connector inserted into the connector guide block, the connector having the recess at which the retainer is fitted can be smoothly inserted into the connector guide block in the transverse direction without any interruption. Furthermore, incomplete-fitting of the retainer can be detected reliably by the detection plate activated in conjunction with the continuity testing part, without relying on the manual detection by the worker.

Furthermore, the present invention provides, in a second aspect, the continuity testing device described above, wherein the drive mechanism includes a push pin arranged to move up and down together with the continuity testing part and a pivotally-movable lever activated by the push pin to move the detection pin downward together with the detection plate.

According to the second aspect of the present invention described above, when the continuity testing part is moved upward, the push pin is moved upward in conjunction with the continuity testing part, and then the push pin rotates the lever to move the detection plate and the detection pin in the downward direction. Thus, the lever serves to convert the upward movement of the push pin into the downward movement of the detection plate.

Consequently, since the upward movement of the continuity testing part is converted into the downward movement of the detection plate using the push pin and the lever, the detection plate can be moved downward easily and reliably, and the incomplete-fitting of the retainer can be detected with high accuracy.

Furthermore, the present invention provides, in a third aspect, the continuity testing device described above, wherein the detection pin is arranged to penetrate through the detection plate in a direction perpendicular to the detection plate, an upper portion of the detection pin is provided with a weak spring, wherein an upper end portion of the weak spring is arranged to be compressed by the lever, and a lower portion of the detection pin is provided with a stiff spring, wherein a lower end of the stiff spring is supported by the connector guide block.

According to the third aspect of the present invention described above, the push pin pushes up an one end of the lever to rotate the lever, and the other end of the rotated lever compresses the weak spring provided above the detection plate to move the detection plate downward. When the detection plate is contacted with the incompletely fitted retainer, the stiff spring provided below the detection plate is compressed slightly, so the stiff spring pushes back the detection plate, preventing the detection plate from being moved further in the downward direction. As a result, the retainer can be prevented from being deformed or damaged by the detection plate.

Furthermore, the present invention provides, in a fourth aspect, the continuity testing device described above, wherein at least the case, the upper cover plate and an air cylinder used in the continuity testing device are arranged to be used in common in an another continuity testing device, the another continuity testing device having a connector insertion part arranged to receive a connector inserted into the connector insertion part along the vertical direction. The connector insertion part of the another continuity testing device is received in the case and covered with the upper cover plate, and a continuity testing part of the another continuity testing device received in the case is moved by the air cylinder in the vertical direction.

According to the fourth aspect of the present invention described above, since the case, the upper cover plate and an air cylinder used in the continuity testing device can be utilized in common in the another continuity testing device for the connector inserted in the vertical direction, the cost of the continuity testing device can be reduced.

DETAILED DESCRIPTION OF THE INVENTION

One embodiment of a continuity testing device according to the present invention is described below in reference with FIGS. 1 through 8.

Figure 1:
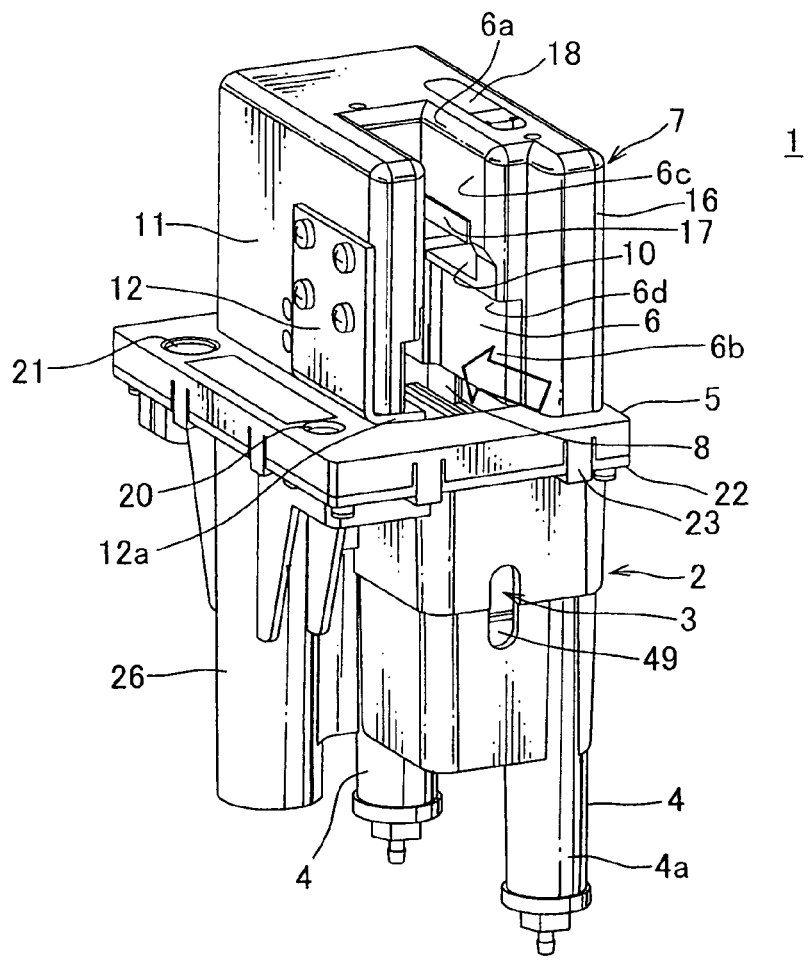
FIG. 1 is a perspective view of one embodiment of a continuity testing device according to the present invention.

Referring to FIG. 1, a continuity testing device 1 according to the present invention includes a case 2 made of synthetic resin or metal, a continuity testing part 3 arranged inside the case 2, a vertical air cylinder 4 arranged to move the continuity testing part 3 up and down in the vertical direction, an upper cover plate 5 provided on the case 2 and a connector guide block 7 made of synthetic resin and threadably mounted on the upper cover plate 5. The connector guide block 7 includes therein a connector insertion part 6. In the description, the vertical direction corresponds to the longitudinal direction of the continuity testing device, the transverse or the horizontal direction corresponds to a direction perpendicular to the vertical direction.

Figure 10:
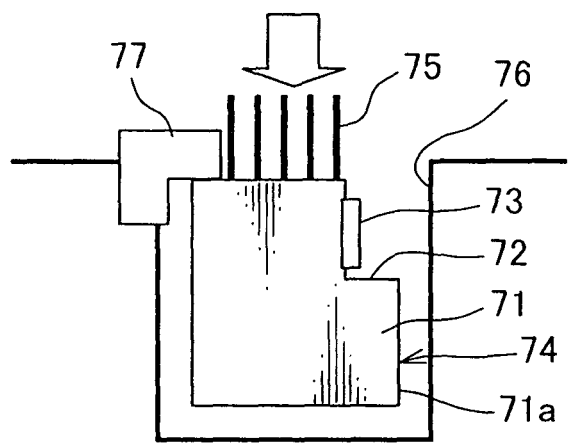
FIG. 10 is an illustration showing a portion of a conventional continuity testing device.

The cover plate 5 is provided with a rectangular opening 8 penetrating through the cover plate 5 in the vertical direction. The connector insertion part 6, which is a space for receiving a connector, of the connector guide block 7 is arranged above the opening 8 so as to communicate with the opening 8. A connector of a wire harness (not shown) having a stepped shape (i.e. recess) similar to the shape of the connector 74 shown in FIG. 10 is to be inserted into the connector insertion part 6 in the transverse direction from the front into the back of the connector guide block 7, as shown in FIG. 1 by an arrow. In this case, an electric wire (not shown) connected to the connector is drawn out from an upper opening 6a of the connector insertion part 6. In the description, the term "front" means a side at which the connector insertion part 6 opens, and the term "back" means a side adjacent to a later-described back wall 27 (FIG. 27) of the connector guide block 7.

Figure 2:
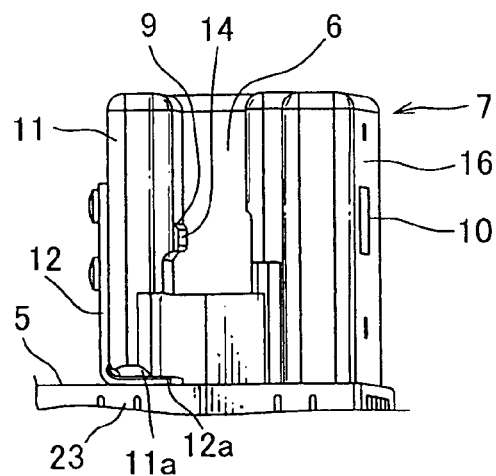
FIG. 2 is a front view of a connector guide block of the continuity testing device of FIG. 1.
Figure 3:
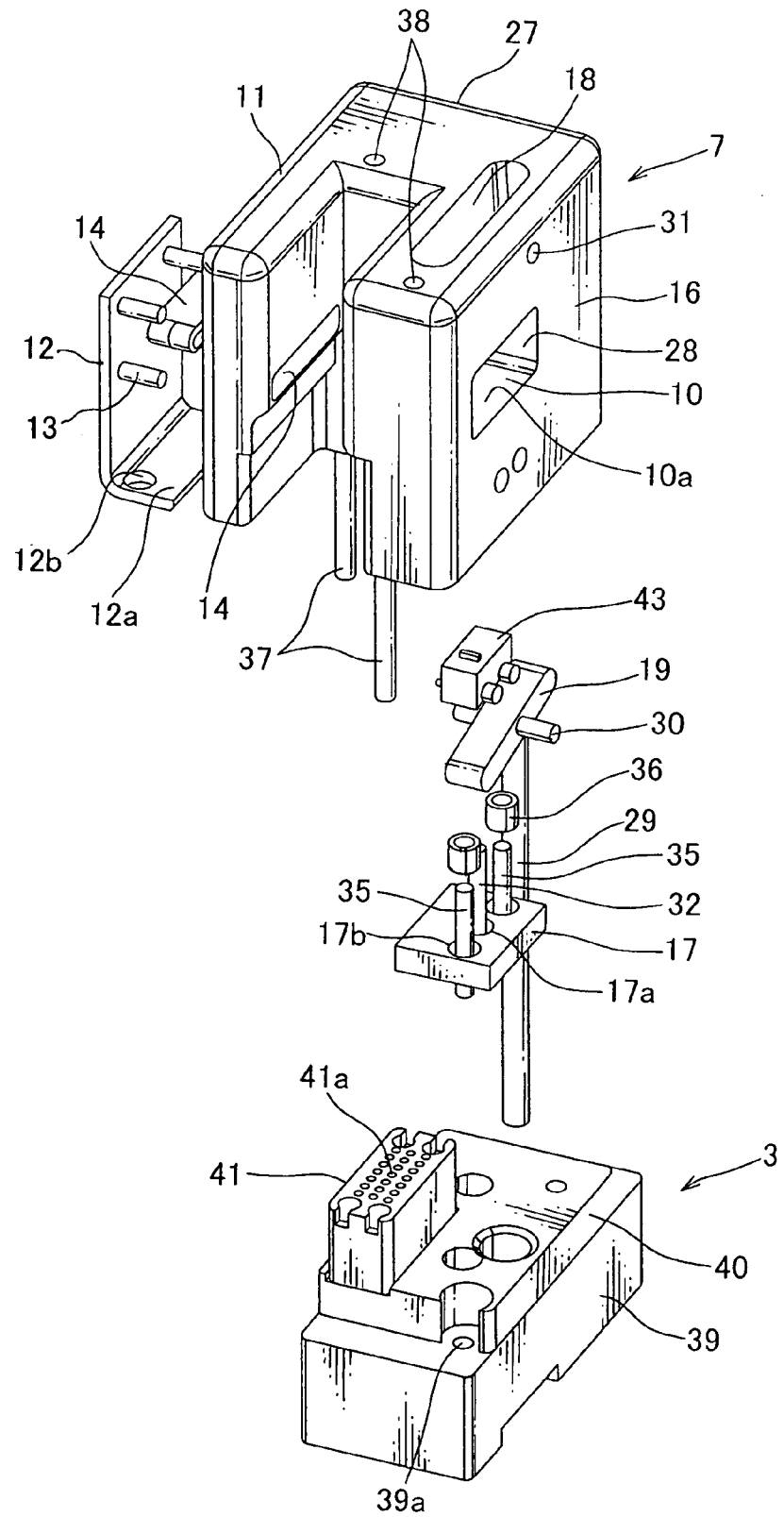
FIG. 3 is an exploded view of the continuity testing device of FIG. 1.
Figure 8:
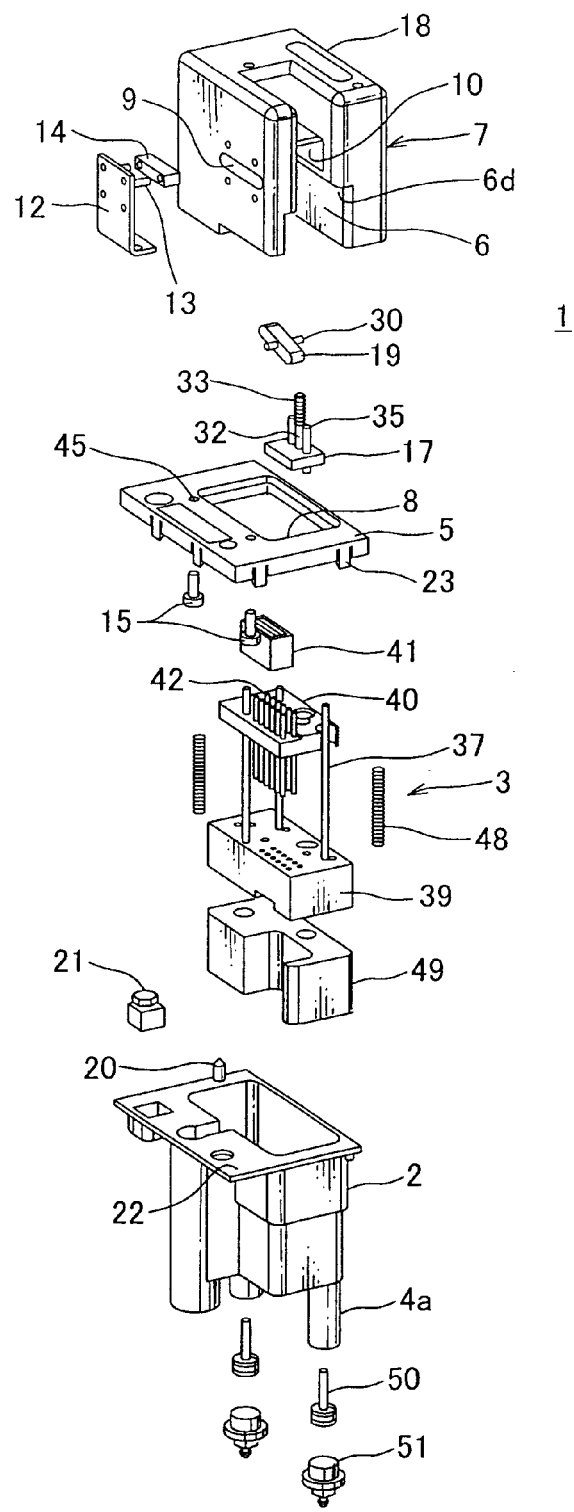
FIG. 8 is an exploded view of the entire structure of the continuity testing device.

The connector insertion part 6 is formed into a shape corresponding to the shape of the connector, so the connector insertion part 6 includes a relatively wide lower portion 6b and a relatively narrow upper half portion 6c. Referring also to FIGS. 2, 3 and 8, the upper half portion 6c of the connector insertion part 6 is provided with horizontally-extending side apertures 9 and 10 formed on vertical side walls 11 and 16 of the connector guide block 7, respectively. The side aperture 10 provided to the side wall 16 is relatively large and the side aperture 9 provided to the side wall 11 is relatively small. A L-shaped metallic bracket 12 is threadably mounted on an outer surface of the side wall 11 of the connector guide block 7. The bracket 12 includes a coil spring 13 and a connector pressing member 14 provided to the bracket 12 via the coil spring 13. As shown in FIG. 2, the connector pressing member 14 is arranged so as to elastically project from the side aperture 9 toward inside of the connector insertion part 6.

Referring particularly to FIGS. 2, 3, and 8, a bottom plate 12a of the bracket 12 is retained between a stepped lower face 11a of the side wall 11 and an upper face of the cover plate 5, and is fixed to the side wall 11 using a bolt 15 (FIG. 8) passed through a hole 12b (FIG. 3) of the bracket 12 from underneath the cover plate 5. The side aperture 10 formed on the side wall 16 of the connector guide block 7 is provided with a rectangular detection plate 17. The detection plate 17 is arranged within the side aperture 10 so as to move up and down in the vertical direction. As described below, the detection plate 17 detects incomplete-fitting of a retainer fitted to the connector. The retainer of the connector is similar to the one shown in FIG. 10, and the expression of "incomplete-fitting of the retainer" means a state in which the retainer is only half-fitted or not completely-fitted to the connector. In addition, the side aperture 10 is communicated with an upper aperture 18 formed on the side wall 16. As described in detail below, the upper aperture 18 is arranged to receive therein a later-described lever 19 (FIG. 3).

The cover plate 5 is provided with an indication lamp 20 such as an LED and a push button 21 for releasing the connector. The indication lamp 20 is used to indicate an error or to indicate which continuity testing device to be used. Referring to FIGS. 1 and 8, the cover plate 5 is fixed to a thin plate-like flange 22 of the case 2 by an engagement claw 23. There are provided two air cylinders 4 for moving the continuity testing part 3 up and down in the vertical direction. In addition, as described in more detail below in reference with FIG. 9, for a connector 25 without a recess (i.e. the connector 25 having no stepped shape), the above-described connector guide block 7 may be removed and an another connector guide block 24 may be provided below the cover plate 5. In this case, the connector 25 may be inserted into the connector guide block 24 downward from the upward position in the vertical direction. In FIG. 1, an air cylinder 26 serves to fix the connecter 25 to be inserted in the vertical direction.

As shown particularly in FIG. 3, the connector guide block 7 is formed into a C-like shape when seen from a top with the side walls 11, 16 and a back wall 27. The side wall 16 includes a through hole 28 penetrating through the side wall 16 in the vertical direction and arranged adjacent to the back wall 27. The through hole 28 is communicated with the upper aperture 18 and with the side wall 10. The lever 19 having an elongated shape is arranged within the upper opening 18 extending in the front-back direction (i.e. a direction in which the connector is inserted). The lever 19 is provided with a horizontal shaft 30 arranged at a middle portion of the lever 19. The shaft 30 extends in the right-left direction (i.e. a direction from the side wall 11 to the side wall 16) and is inserted into a bearing hole 31 formed on the side wall 16. In this way, the lever 19 is support by the shaft 30 as a supporting point so as to pivotally rotate around the shaft 30 in the vertical direction. Furthermore, a push pin 29 is arranged such that an upper end of the push pin 29 can contact with a back end 19b of a lower face of the lever 19.

Figure 4:
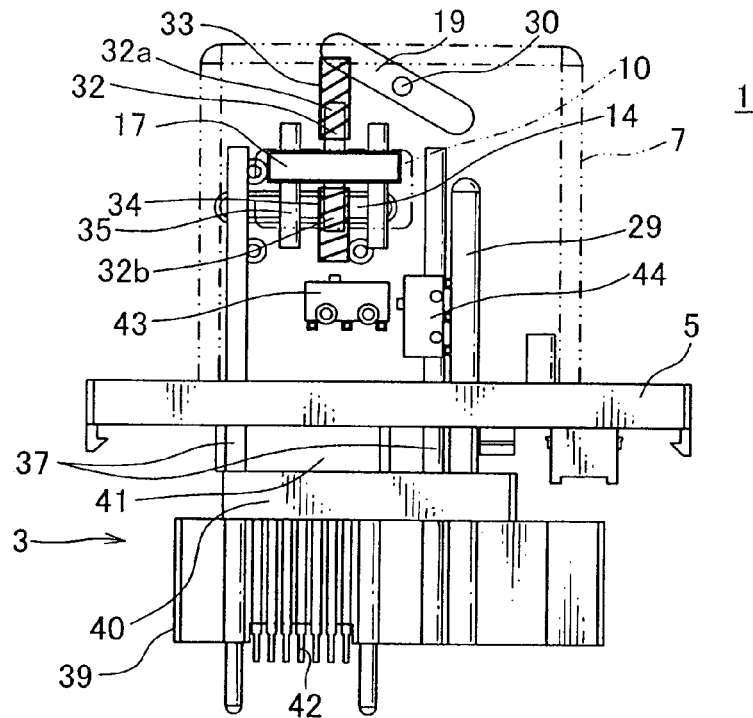
FIG. 4 is an illustration of an interior structure of the continuity testing device of FIG. 1 in a default position.

Furthermore, the detection plate 17 is provided with a vertical detection pin 32 passed through a central hole 17a formed at a center of the detection plate 17 and fixed to the detection plate 17. An upper end of the detection pin 32 is arranged to be contacted with a front end 19a of the lower face of the lever 19. Referring to FIG. 4, an upper coil spring 33 and a lower coil spring 34 are provided to an upper portion and a lower end portion of the detection pin 32, respectively. The lower coil spring 34 is stiffer than the upper coil spring 33 (so the upper coil spring 33 is weaker than the lower coil spring 34). Furthermore, the detection plate 17 is provided with a pair of short guide pins 35. The respective short guide pins 35 are passed through respective holes 17b formed on the detection plate 17 on both sides of the central hole 17a in the front-back direction, so that the guide pins 35 can slidably move in the vertical direction. In addition, a short circular-tube-like receiving member 36 is arranged above the respective short guide pins 35, as shown in FIG. 3. Again, the detection plate 17 is arranged to move up and down within the side aperture 10. The upper portion of the detection pin 32, an upper portion of the respective short guide pins 35 and the upper spring 33 are arranged to be inserted into the upper aperture 18 while the lower portion of the detection pin 32, a lower portion of the respective guide pins 25 and the lower spring 34 are arranged to be inserted into a lower aperture (not shown) extending downward from a bottom face 10a of the side aperture 10.

As shown in FIG. 3, the connector guide block 7 further includes two diagonally-arranged long guide pins 37. The long guide pins 37 are arranged to project downward from a lower face of the connector guide block 7 and are slidably passed through vertical through holes 38, respectively. Each guide pin 37 is also passed through a vertical through hole 39a formed at a lower block of the continuity testing part 3 made of synthetic resin. A block plate 40 is disposed on the lower block 39, and an inner guide block 41 is disposed on the block plate 40. Each of the lower block 39, the block plate 40 and the inner guide block 41 is provided with a plurality of holes 41a through which probe pins 42 (shown in FIG. 4) are passed in the vertical direction. The lower block 39, the block plate 40 and the inner guide block 41 are arranged to move up and down together in the vertical direction with the probe pins 42 by using the two air cylinders 4. In addition, the connector guide block 7 further includes a front switch 43 and a back switch 44 (e.g. a micro switch) which are arranged along the front-back direction, as shown in FIG. 3.

Figure 5:
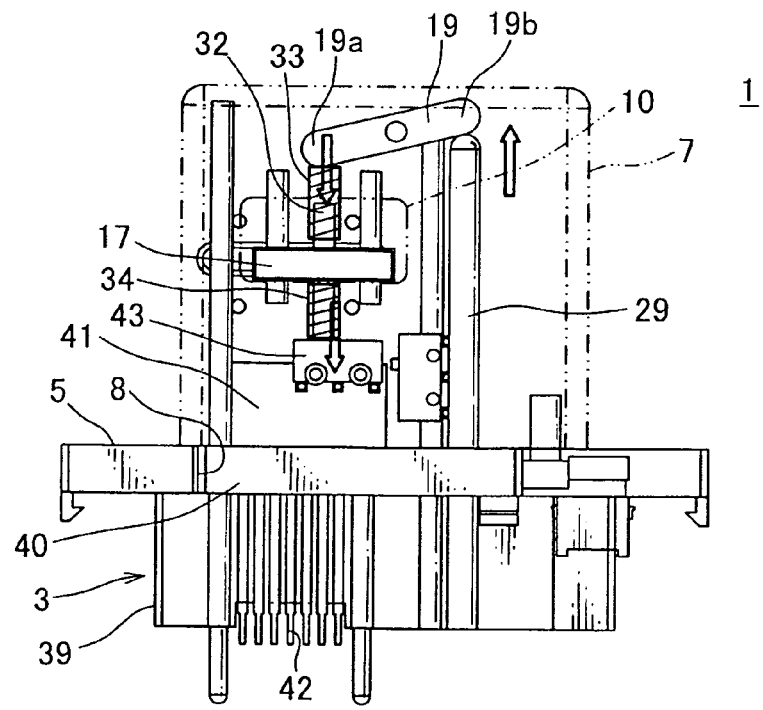
FIG. 5 is an illustration of the interior structure of the continuity testing device of FIG. 1 showing the operation of the continuity testing device if a retainer is completely fitted to a connector.
Figure 6:
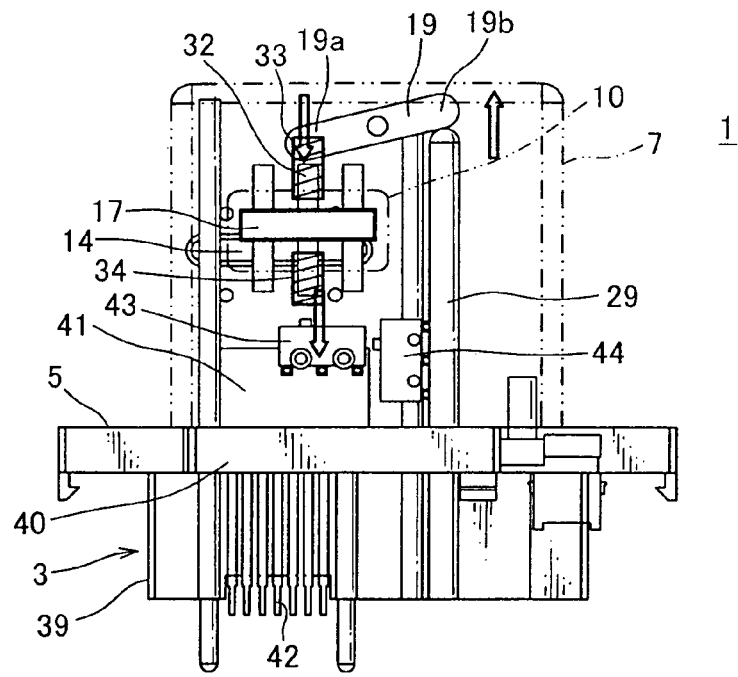
FIG. 6 is an illustration of the interior structure of the continuity testing device of FIG. 1 showing the operation of the continuity testing device if the retainer is incompletely fitted to the connector.

Referring to FIGS. 4 through 6, the operation of the continuity testing device 1 will be explained below. Firstly, FIG. 4 shows the continuity testing device 1 in an initial (default) position. As described above, the connector guide block 7 is located on the cover plate 5 of the case 2. The lever 19, the detection plate 17, the detection pin 32, the upper and the lower springs 33, 34, the pair of short guide pins 35, the connector pushing member 14 and the front and the back switches 43, 44 are arranged within the connector guide block 7. The detection plate 17 is being pushed upward by the stiff lower spring 34 so that an upper face of the detection plate 17 is in contact with an upper face of the side aperture 10. Thus, the detection plate 17 is positioned above the retainer of the connector inserted into the connector guide block 7.

The push pin 29 and the long guide pins 37 are arranged to penetrate through the cover plate 5 in the vertical direction. The inner block 41, the block plate 40 and the lower block 39 together constitute the continuity testing part 3. The push pin 29 and the long guide pin 37 penetrating through the block plate 40 and the lower block 39 are fixed to the lower block 39. Thus, the drive mechanism for operating the detection plate 17 is constituted with the push pin 29 and the lever 19, or specifically with the push pin 29, the lever 19 and the upper and the lower springs 33, 34.

The upper coil spring 33 and the lower coil spring 34 are provided to the upper portion 32a and the lower portion 32b of the detection pin 32, respectively (i.e. the detection pin 32 is inserted into the coil springs 33, 34). The front end 19a of the lower face of the lever 19 is arranged in contact with the upper end of the weak upper spring 33 so the front end 19a of the lever 19 is directed upward. The lower end of the stiff lower spring 34 is borne and supported by a horizontal wall formed within the connector guide block 7. The front switch 43 is arranged below the detection pin 32, and the back switch 44 is arranged on the back wall 27 so as to project into the connector insertion part 6 to detect the insertion of the connector into the connector insertion part 6.

Next, FIG. 5 shows the operation of the continuity testing device 1 in the continuity test for the connector with the retainer completely fitted to the connector. First the push pin 29 is moved upward together with the continuity testing part 3 by operating (extending) the air cylinder 4. The push pin 29 then pushes up the back end 19b of the lever 19 to move the front end 19a of the lever 19 downward. Then, the front end 19a of the lever 19 pushes down the detection pin 32 together with the detection pin 17 via the weak upper spring 33. In this case, since the retainer is completely fitted to the connector (so the retainer does not project from the connector), the detection plate 17 is moved downward without making contact with the retainer while compressing the stiff lower spring 34, thereby allowing the detection pin 32 to move down and turn on the switch 43 to indicate, using a lamp and such, that the retainer is completely fitted to the connector. The detection plate 17 stops when a lower face of the detection plate 17 has contacted with a lower face of the side aperture 10.

At the same time, the continuity testing part 3 is moved upward, inserting the inner guide 41 into the connector guide block 7 through the opening 8 of the cover plate 5 to make the probe pins 42 to contact with the terminal of the electric wire within the connector. In this way, the electric wire connected to the terminal and an electric wire connected to the probe pins 42 together form a closed circuit via a control unit (not shown), thereby detecting the electrical continuity. The detection of the continuity is then indicated using for example an indication lamp. In this state, the block plate 40 is positioned within the opening 8 of the cover plate 5, and the lower block 39 is positioned below the cover plate 5.

Next, FIG. 6 shows the operation of the continuity testing device 1 in the continuity test in case of the connector with the retainer incompletely fitted to the connector. As in the case of FIG. 5 described above, first the push pin 29 is moved upward together with the continuity testing part 3, pushing up the back end 19b of the lever 19. Thus, the front end 19a of the lever 19 is moved downward, pushing down the detection pin 32 and the detection pin 17. However, in this case, the retainer is not completely fitted to the connector (so the retainer is projecting from the connector). Thus, when the lower face of the detection plate 17 has contacted with an upper end of the retainer of the connecter, the weak upper spring 33 is fully compressed and the front end 19a of the lever 19 will contact with the upper end of the detection pin 32. At this point, the compressed stiff lower spring 34 functions to elastically support (receive) the detection pin 32. Thus, the detection plate 17 is prevented from being moved further in the downward direction, so the detection plate 17 does not apply an excessive force on the retainer, thereby preventing the retainer from being deformed or damaged.

In this case, as shown in FIG. 6, an lower end of the detection pin 32 does not reach to the switch 43 and thus the switch 43 is not activated. This can be detected as an abnormality in the fitting of the retainer and can be indicated by, for example, the indication lamp 20. For example, such detection of the abnormality may be performed using a timer-controlled operation using a control unit. Specifically, the switch 44 for detecting the connector is turned on to automatically move the continuity testing part 3 and the push pin 29 upward, and at the same time the control unit determines a time from the detection of the insertion of the connector by the switch 44 until when the switch 43 is activated by the detection pin 32 to indicate the abnormality in the fitting of the retainer.

Referring further to the case of FIG. 6, the detection plate 17 stops at a middle with respect to the height of the side aperture 10. The connector pressing member 14 is located at the same height with the retainer and at the opposite side. The connector pressing member 14 presses the connector (or a connector housing made of synthetic resin) in the direction of projection of the retainer to push the connector against an inner face of the connector insertion part 6, thereby preventing the play of the connector to perform an accurate detection of the retainer as well as the continuity test. In addition, by operating the push button 21 shown in FIG. 1, the push pin 29 and the continuity testing part 3 are moved downward (returned to a default position), and the detection plate 17 is moved upward together with the detection pin 32 by the elastic force by the lower spring 34. Finally, the connector is released in the connector guide block 7.

Figures 7A, 7B:
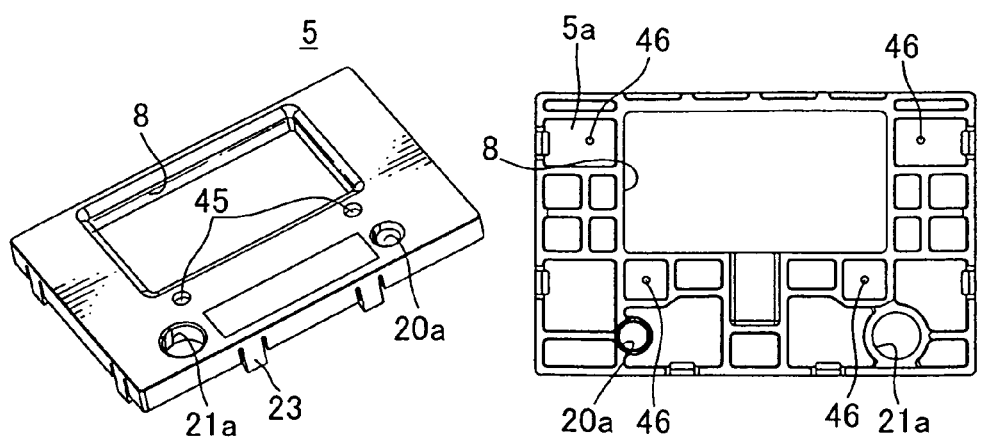
FIG. 7A is a front perspective view of an upper cover plate of a case of the continuity testing device.
FIG. 7B is a back view of the upper cover plate of the case of the continuity testing device.

FIGS. 7A and 7B show the front and the back view of the cover plate 5 of the case 2, respectively. As shown, the cover plate 5 includes the opening 8, a connector fixation hole 45, a button hole 21a and a lamp hole 20a. The connector fixation hole 45 may be formed at an accurate position on the cover plate 5 by providing a punch mark 46 on a back face 5a of the cover plate 5 at a position corresponding to the position of the connector fixation hole 45, as shown in FIG. 7B, which is then drilled to form the connector fixation hole 45. In FIG. 7B, there are provided four punch marks 46. Referring also to FIG. 8, the connector guide block 7 can by fixed on the upper face of the cover plate 5 by simply inserting the bolt (or a screw) 15 into the four connector fixation holes 45 (FIG. 7A only shows two holes 45) from back side and fixing to a hole on the lower face of the connector guide block 7.

Alternatively, the connector fixation hole 45 may be eliminated in the case of using a later-described connector insertion part 47 shown in FIG. 9 without using the connector guide block 7, in which a connector 25 is inserted into the connector insertion part 47 arranged below the opening 8 of the cover plate 5.

Referring again to FIG. 8 showing an exploded view of the continuity testing device 1 with the connector guide block 7, there is shown the bracket 12, the connector pressing member 14 pushed by the front and back horizontal coil springs 13, the lever 19 with the shaft 30, the detection plate 17, the detection pin 32, the upper coil spring 33, the short guide pin 35, the cover plate 5, the bolt 15 (or a split pin for fixing the connector guide block 7 to the cover plate 5), the inner guide block 41, the block plate 40, the lower block 39, the probe pins 42 passed through the holes of the block plate 40, the long guide pin 37 passed through both of the block plate 40 and the lower block 39, a coil spring 48 provided to the guide pin 37 to push the block plate 40 toward the inner guide 41, a fixation block 49, the push button 21, the indication lamp 20, the case 2, a piston rod 50 slidably inserted into a tubular cylinder body 4a arranged at bottom of the case 2, and an air supplying plug 51 covering a lower opening of the cylinder body 4a.

Figure 9:
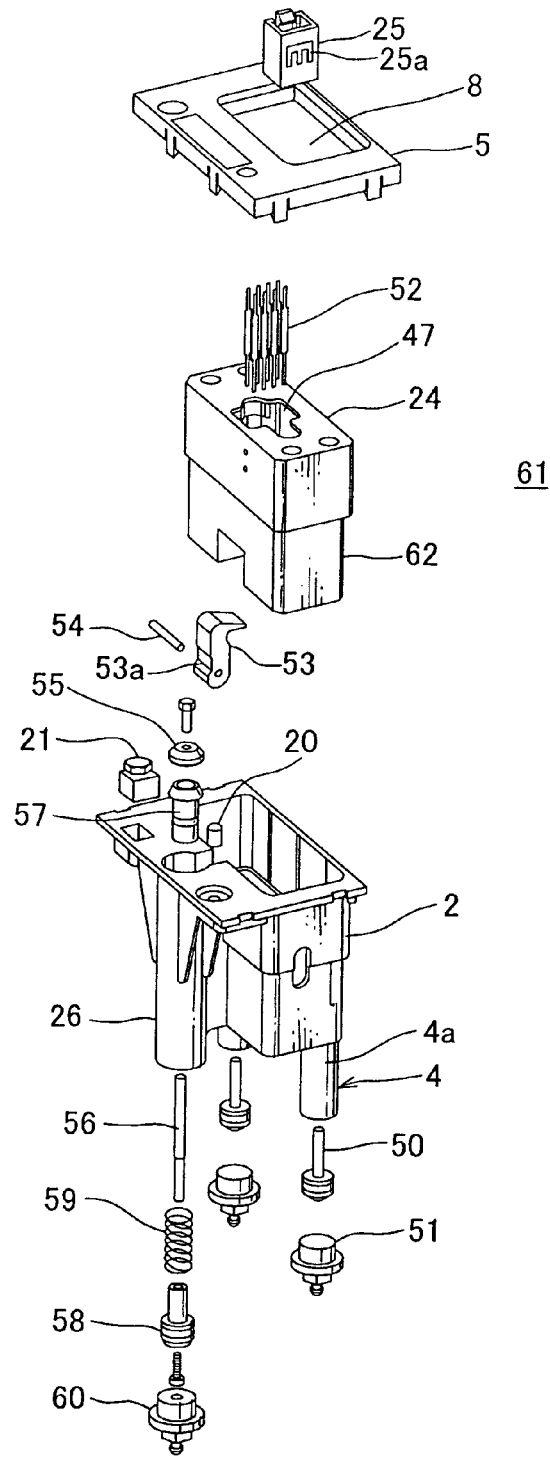
FIG. 9 is an exploded view of another continuity testing device.

Referring to FIG. 9, the following will describe a continuity testing device 61 used for inserting the connector 25 along the vertical direction without using the connector guide block 7. In FIG. 9, the components similar to those of FIG. 8 are indicated with the same reference signs.

In FIG. 9, there is shown the connector 25 having no step or recess, a retainer 25a, probe pins 52, a connector guide block 24 having the connector insertion part 47, a continuity testing part 62, a connector locking claw 53 rotatably supported by a shaft 54 and mounted to an upper left portion of the case 2, a ring 55 arranged to contact with a curved face 53a at a lower portion of the connector locking claw 53 to rotate the connector locking claw 53 in the right-left direction, a piston rod body 56 to which the ring 55 is fixed at an upper end of the piston rod body 56 by a bolt, a guide tube 57 slidably supporting the piston rod body 56 within the air cylinder 26 of the case 2, a piston 58 fixed to a lower end of the piston rod body 56 by a screw, a coil spring 59 pushing the piston 58 downward within the air cylinder 26 and a plug 60 covering a lower opening of the air cylinder 26. There are also shown the cover plate 5, the push button 21, the indication lamp 20, the case 2 and the air supplying plug 51 which are used in common in the continuity testing device 1 of FIG. 8.

The connector guide block 24 is provide with the connector insertion part 47 as an opening into which the connector 25 is inserted. This connector insertion part 47 is arranged at an upper portion of the connector guide block 24 below the opening 8 of the cover plate 5. The probe pins 52 are arranged to pass through the continuity testing part (a lower block) 62. The continuity testing part 62 is moved up and down using the front and the back air cylinders 4 to insert an upper end of the probe pin 52 into the connector insertion part 47. The air cylinder 4 is constituted with the piston rod 50, the cylinder body 4a of the case 2 and the plug 51. The basic structure of the continuity testing part 62 is the same as the continuity testing part 3 of FIG. 8.

When performing the continuity test, first the connector 25 is inserted into the connector insertion part 47, and the locking claw 53 is engaged with an upper face of the connector 25. Then, the continuity testing part 62 and the probe pins 52 are moved upward by the piston rods 50 of the air cylinders 4, thereby making the probe pins 52 in contact with a terminal of an electric wire in the connector 25 to make a closed circuit to detect the electrical continuity. Thus connector locking structure such as the locking claw 53 is not necessary in the continuity testing device 1 of FIG. 8, since the continuity testing device 1 of FIG. 8 is provided with a step 6d at the connector insertion part 6 arranged to engage with the recess formed at the connector to prevent the connector from moving upward.

In order to detect the incomplete-fitting of the retainer 25a of the connector 25 having no step or recess, there is provided a protrusion (not shown) in the connector insertion part 47 so as to contact (interfere) with the incompletely-fitted retainer 25a to prevent the connector 25 from being inserted further into the connector insertion part 47.

As described above, the continuity testing device 1 of FIG. 8 utilizes the case 2, the cover plate 5, the piston rod 50, the plug 51, the push button 21 and the indication lamp which are used in common in the continuity testing device 61 of FIG. 9. Thus, the cost of the continuity testing device 1 can be reduced.

In the case of using the continuity testing device 1 of FIG. 8 to detect the incomplete-fitting of the retainer 25a of the connector 25 without the step or recess, the connector insertion part 6 of the connector guide block 7 may be formed without the step 6d (i.e. formed into a flat shape in the vertical direction), or a step may be formed at an upper portion of the connector insertion part 6 so as to engage with an upper end of the connector 25.

In the above-described exemplary embodiment, the lever 19 is used to operate the detection pin 32 and the detection plate 17. However, the present invention is not limited to this, and the detection plate 17 may be operated without using the lever 19 by providing a hook (not shown) connecting the detection plate 17 and the upper end of the push pin 29 so that the detection plate 17 is directly moved up and down in accordance with the up-down movement of the push pin 29. In an alternative embodiment, the detection plate 17 may be provided with a member allowing the detection plate 17 to move together with the continuity testing part 3.

As described above, the embodiments described herein are only representative embodiments and are not intended to limit the present invention. It will be understood that various modifications to the embodiments may be made without departing the scope of the present invention.

What is claimed is:

1. A continuity testing device comprising:
   a connector guide block fixed above an opening formed at an upper cover plate of a case of the continuity testing device, the connector guide block being arranged to guide an insertion of a connector having a recess at which a retainer is fitted into the connector guide block in a transverse direction;
   a detection plate provided at the connector guide block so as to move in a vertical direction, the detection plate being located above the retainer of the connector placed within the connector guide block such that when the detection plate is moved downward with a detection pin fixed to the detection plate, an under surface of the detection plate contacts with a top surface of the retainer of the connector which is incompletely fitted to the connector;
   a continuity testing part having a probe pin and arranged to move in the vertical direction toward the connector;
   a drive mechanism that activates the detection plate to move in the vertical direction in conjunction with the continuity testing part;
   a switch arranged to be activated by the detection pin when the detection pin is completely moved down to the switch; and
   guide pins passing through respective holes of the detection plate.

2. The continuity testing device according to claim 1, wherein the drive mechanism includes a push pin arranged to move up and down together with the continuity testing part and a pivotally-movable lever activated by the push pin to make the detection pin and the detection plate move downward.

3. The continuity testing device according to claim 2, wherein
   the detection pin is arranged to penetrate through the detection plate in a direction perpendicular to the detection plate,
   an upper portion of the detection pin is provided with a weak spring, wherein an upper end of the weak spring is pushed by the lever, and
   a lower portion of the detection pin is provided with a stiff spring, wherein a lower end of the stiff spring is supported by the connector guide block.

4. The continuity testing device according to claim 3, wherein at least the case, the upper cover plate and an air cylinder used in the continuity testing device are arranged to be used in common in an another continuity testing device, the another continuity testing device having a connector insertion part arranged to receive a connector inserted into the connector insertion part along the vertical direction, wherein the connector insertion part of the another continuity testing device is received in the case and covered with the upper cover plate, and a continuity testing part of the another continuity testing device received in the case is moved by the air cylinder in the vertical direction.

5. The continuity testing device according to claim 2, wherein at least the case, the upper cover plate and an air cylinder used in the continuity testing device are arranged to be used in common in an another continuity testing device, the another continuity testing device having a connector insertion part arranged to receive a connector inserted into the connector insertion part along the vertical direction,
wherein the connector insertion part of the another continuity testing device is received in the case and covered with the upper cover plate, and a continuity testing part of the another continuity testing device received in the case is moved by the air cylinder in the vertical direction.

6. The continuity testing device according to claim 1, wherein at least the case, the upper cover plate and an air cylinder used in the continuity testing device are arranged to be used in common in an another continuity testing device, the another continuity testing device having a connector insertion part arranged to receive a connector inserted into the connector insertion part along the vertical direction,
wherein the connector insertion part of the another continuity testing device is received in the case and covered with the upper cover plate, and a continuity testing part of the another continuity testing device received in the case is moved by the air cylinder in the vertical direction.

7. The continuity testing device according to claim 1, further comprising the switch to be turned on by the detection pin to indicate that the retainer is completely fitted to the connector.

* * * * *